(12) United States Patent
Lavric et al.

(10) Patent No.: US 12,310,060 B2
(45) Date of Patent: May 20, 2025

(54) GATE-ALL-AROUND INTEGRATED CIRCUIT STRUCTURES HAVING UNIFORM THRESHOLD VOLTAGES AND TIGHT GATE ENDCAP TOLERANCES

(71) Applicant: Intel Corporation, Santa Clara, CA (US)

(72) Inventors: Dan S. Lavric, Beaverton, OR (US); Dax M. Crum, Beaverton, OR (US); David J. Towner, Portland, OR (US); Orb Acton, Portland, OR (US); Jitendra Kumar Jha, Hillsboro, OR (US); YenTing Chiu, Portland, OR (US); Mohit K. Haran, Hillsboro, OR (US); Oleg Golonzka, Beaverton, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 819 days.

(21) Appl. No.: 17/357,711

(22) Filed: Jun. 24, 2021

(65) Prior Publication Data
US 2022/0416039 A1    Dec. 29, 2022

(51) Int. Cl.
*H01L 29/423* (2006.01)
*H01L 29/06* (2006.01)
(Continued)

(52) U.S. Cl.
CPC ..... *H10D 30/6735* (2025.01); *H10D 30/6757* (2025.01); *H10D 62/121* (2025.01); *H10D 64/667* (2025.01); *H10D 84/85* (2025.01)

(58) Field of Classification Search
CPC ............. H01L 29/42392; H01L 27/092; H01L 29/0673; H01L 29/4966; H01L 29/78696;
(Continued)

(56) References Cited

U.S. PATENT DOCUMENTS

| 2015/0014780 A1 | 1/2015 | Kim |
| 2018/0342427 A1 | 11/2018 | Xie |

(Continued)

OTHER PUBLICATIONS

Extended European Search Report from European Patent Application No. 22163910.7, mailed Aug. 10, 2022, 13 pgs.

*Primary Examiner* — Tong-Ho Kim
(74) *Attorney, Agent, or Firm* — Schwabe, Williamson & Wyatt, P.C.

(57) ABSTRACT

An integrated circuit structure comprises a first and second vertical arrangement of horizontal nanowires in a PMOS region and in an NMOS region. A first gate stack having a P-type conductive layer surrounds the first vertical arrangement of horizontal nanowires. A second gate stack surrounds the second vertical arrangement of horizontal nanowires. In one embodiment, the second gate stack has an N-type conductive layer, the P-type conductive layer is over the second gate stack, and an N-type conductive fill is between N-type conductive layer and the P-type conductive layer to provide same polarity metal filled gates. In another embodiment, the second gate stack has an N-type conductive layer comprising Titanium (Ti) and "Nitrogen (N) having a low saturation thickness of 3-3.5 nm surrounding the nanowires, and the N-type conductive layer is covered by the P-type conductive layer.

20 Claims, 8 Drawing Sheets

(51) Int. Cl.
*H01L 29/49* (2006.01)
*H01L 29/786* (2006.01)
*H10D 30/67* (2025.01)
*H10D 62/10* (2025.01)
*H10D 64/66* (2025.01)
*H10D 84/85* (2025.01)

(58) Field of Classification Search
CPC ......... H01L 21/82385; H01L 29/42376; H01L 29/775; H01L 21/823842; B82Y 10/00
USPC ....................................................... 257/369
See application file for complete search history.

(56) References Cited

U.S. PATENT DOCUMENTS

2020/0035567 A1* 1/2020 Chanemougame ... H01L 29/401
2020/0083326 A1* 3/2020 Ok ....................... H01L 27/092
2020/0294865 A1   9/2020 Cheng
2020/0388689 A1* 12/2020 Guler ................. H01L 29/7853

* cited by examiner

GATE-ALL-AROUND INTEGRATED CIRCUIT STRUCTURES HAVING UNIFORM THRESHOLD VOLTAGES AND TIGHT GATE ENDCAP TOLERANCES

TECHNICAL FIELD

Embodiments of the disclosure are in the field of integrated circuits and, in particular, gate-all-around integrated circuit structures having uniform threshold voltages and tight gate endcap tolerances.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

DESCRIPTION OF THE EMBODIMENTS

Figure 1A:
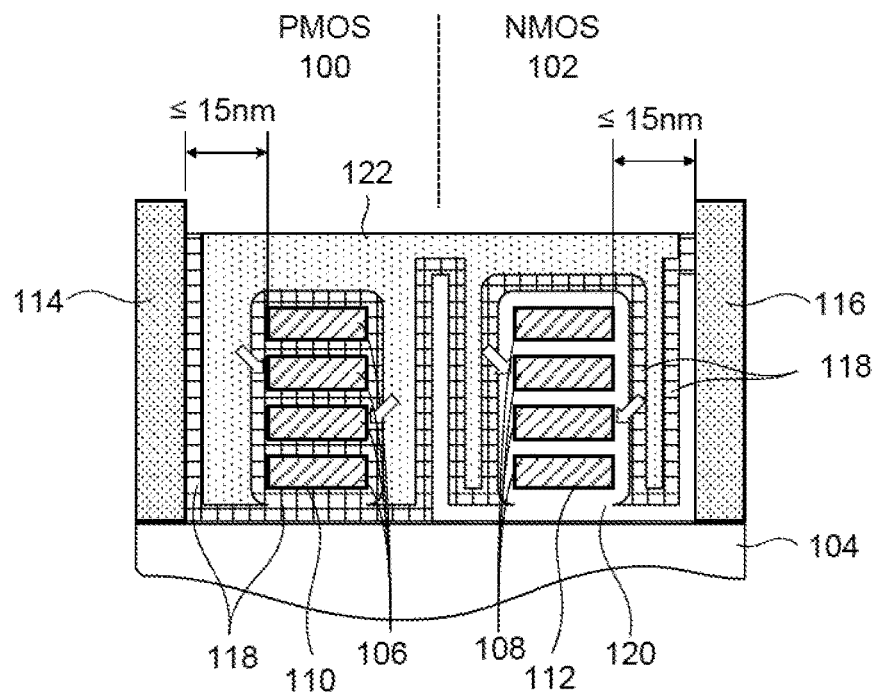
FIGS. 1A-1D illustrate cross-sectional views of gate-all-around (GAA) integrated circuit (IC) with opposite polarity metal gates and different gate endcap tolerances.

Gate-all-around integrated circuit structures having uniform threshold voltages and tight gate endcap tolerances are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to architectures for fabricating gate-all-around integrated circuit structures having uniform threshold voltages and tight gate endcap tolerances. Embodiments may include gate-all-around (GAA) integrated circuit or FinFET transistor architectures utilizing same polarity WFM filled gates or ALD TiSi N-type WFM gates.

To provide context, a subtractive metal gate (SMG) flow has been the semiconductor industry's wide approach since Intel's pioneering 45 nm HiK Metal Gate process. In a standard SMG flow, a work function metal (WFM) thin film is first deposited on an entire wafer, subsequently patterned using a hard mask (HM), and then removed/subtracted in OPEN patterned areas using an isotropic wet etch. While SMG works very well for planar and FinFET transistors, it nonetheless can break down for a Gate All Around (GAA) architecture. The GAA unique architecture renders the isotropic wet etch bias (WEB) of the subtracted/removed metal too large for ensuring minimum N-P boundary conditions. In GAA, the WFM layer can merge in between the nanoribbons (NR). Etching the merged metal can require using very aggressive wet chemistries and/or long etch times. The result inadvertently creates a very large creep/undercut under the hardmask (HM) which fails to protect the WFM in the BLOCK area any longer. The large isotropic WEB in the BLOCK region can render in turn the N-P boundary as very wide which can adversely affect the ability to deliver high transistor density for GAA architecture.

An additive metal gate (AMG) addresses the issues outlined above regarding the subtractive metal gate (SMG) flow approach. In the AMG flow, a high temperature hard mask (HTHM) is first deposited on the whole wafer followed by an HTHM cure anneal and an HTHM patterning to OPEN and BLOCK specific areas on the wafer. Subsequently, a WFM layer is deposited both on top of the OPEN areas above the exposed HiK and on top of the BLOCK areas above the HTHM that is compatible with the temperature of the metal deposition process. Then, a regular HM is being deposited and recessed above the NR exposing WFM layer above the recessed line. A wet etch is then implemented to remove the WFM above the recessed line while the WFM wrapping the NR in the OPEN areas is protected by the regular HM. A standard ash can be implemented to remove both HTHM above the BLOCK and regular HM in OPEN areas. Thus, for GAA, the AMG flow bypasses the difficult isotropic wet etch removal of merged WFM in between NR and its associated large WEB issues that are part of standard SMG flow. In an embodiment, AMG enables tight N-P boundary and high transistor density for GAA architectures.

Advanced high transistor density gate all around GAA Architectures rely on the ability to develop metal gates with uniform threshold voltages. It is also desirable that the metal gates have tight gate endcap tolerances, e.g., ≤10-15 nm, while enabling tight threshold voltage (VT) uniformity control.

Metal gate stacks have been traditionally formed as opposite polarity Work Function Metals (WFM) gate stacks in which two relatively thin conductive layers or WFMs of opposite polarity, P-type (PMOS) and N-type (NMOS) are formed on top of each other.

FIGS. 1A-1D illustrate cross-sectional views of gate-all-around (GAA) integrated circuit (IC) structures with opposite polarity metal gates and different gate endcap tolerances. The gate-all-around integrated circuit structure comprises a PMOS region 100 comprising a first gate stack and an NMOS region 102 comprising a second gate stack above a substrate 104. The PMOS region 100 includes a first plurality of horizontal nanowires 106 (which can be nanoribbons). The NMOS region 102 includes a second plurality of horizontal nanowires 108 (which can be nanoribbons). In one embodiment, the first plurality of horizontal nanowires 106 is adjacent to the second plurality of horizontal nanowires 108. A gate dielectric 110 surrounds nanowires of the first plurality of horizontal nanowires 106. A second gate dielectric layer 112 surrounds nanowires of the second plurality of horizontal nanowires 108. The PMOS region 100 and the NMOS region 102 are included in a trench in a dielectric layer that forms gate endcaps between the nanowires 106 and 108 and gate plugs 114 and 116.

A first gate stack having a first P-type WFM layer 118 is over the first vertical arrangement of horizontal nanowires 106 (e.g., in PMOS region 100). The first gate stack has a first portion surrounding the nanowires of the first vertical arrangement of horizontal nanowires 106, a second portion extending laterally beside and spaced apart from the first portion along a sidewall of gate plug 114, a third portion extending vertically between the first vertical arrangement of horizontal nanowires 108 and the second vertical arrangement of horizontal nanowires 108, and a fourth portion of the P-type WFM layer conformally covering the second gate stack.

A second gate stack is over the second vertical arrangement of horizontal nanowires 108 (e.g., in NMOS region 102), the second gate stack having an N-type WFM layer 120 with a first portion surrounding the nanowires of the second vertical arrangement of horizontal nanowires 108, a second portion extending laterally beside and spaced apart from the first portion, and third portion extending laterally beside and spaced apart from the first portion along a sidewall of gate plug 116. A second P-type WFM layer 118 is over the first N-Type WFM layer 120. A third P-type WFM fill 122 is shown over both the first gate stack in the PMOS region 100 and the second gate stack in the NMOS region 102.

The distance between the gate plugs 114 and 116 to the nearest horizontal nanowires 106 or 108 defines the endcap tolerance. Advanced high transistor density GAA architectures rely on the ability to develop metal gates with very small gate endcap tolerances, e.g., ≤10-15 nm, while enabling tight threshold voltage (VT) uniformity control. For example, FIG. 1A shows a relatively relaxed gate endcap tolerance of less than 15 nm, FIG. 1B shows a relatively tight gate endcap tolerance of less than 10 nm, and FIG. 1C shows a relatively very tight endcap tolerance of less than 5 nm.

Figure 1B:
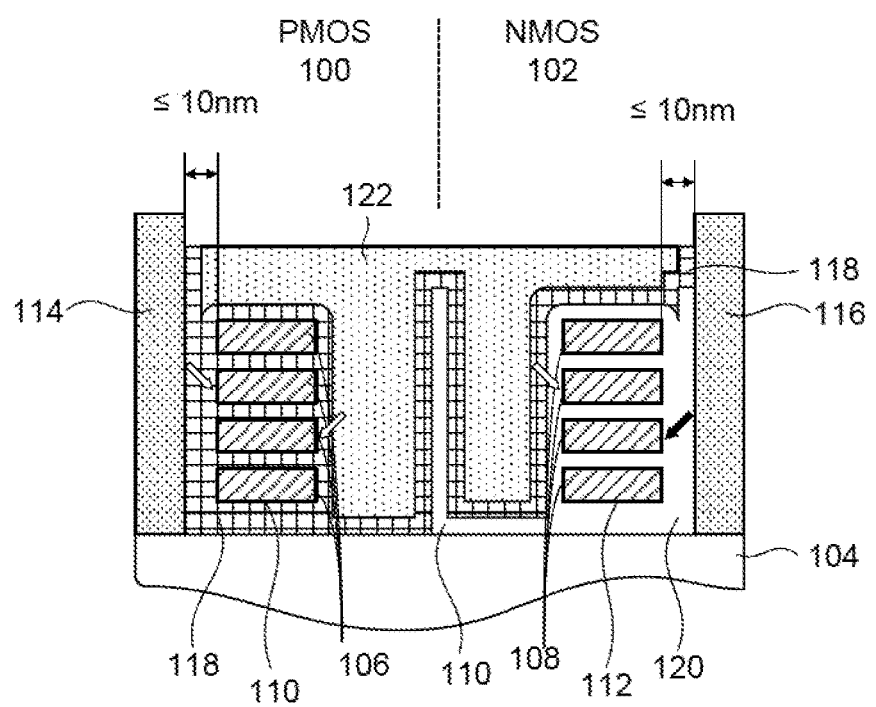
Figure 1C:
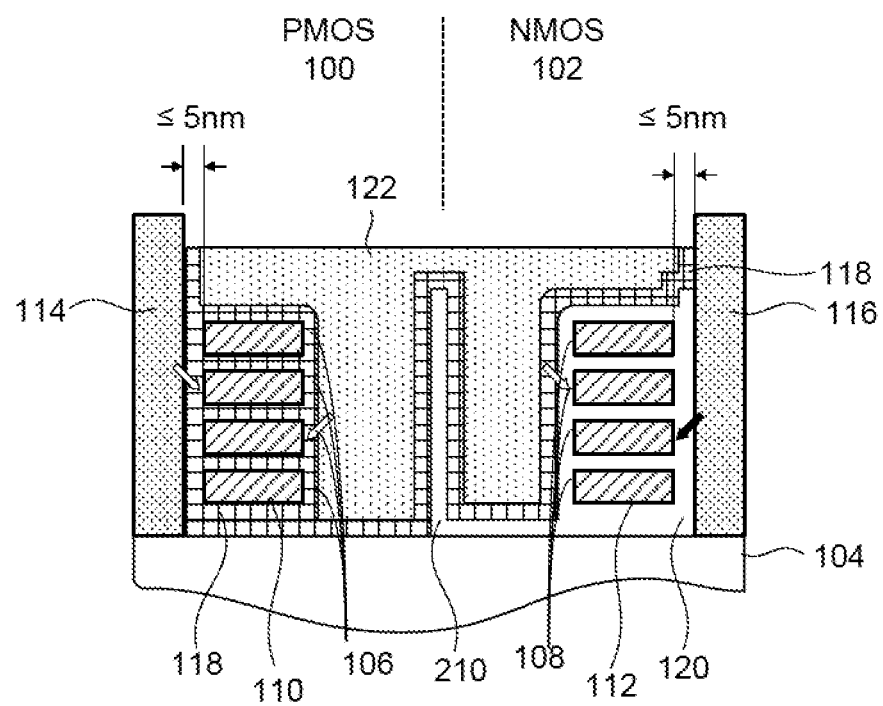
Figure 1D:
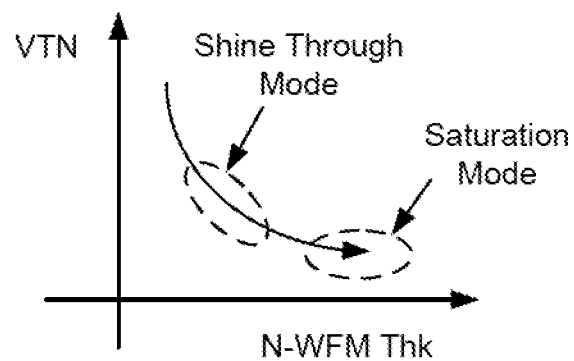

FIG. 1D shows a plot of NMOS VT (VTN) versus the N-type WFM layer 120 thickness (Thk). For opposite polarity WFM gate stacks, one is able to tune VT by modulating the thickness of the bottom WFM by electrostatic "shine thru" effects. For example, the P-type WFM layer 118 may be formed with a thickness of 3.5-4 nm, which is greater than a saturation thickness of 3.5 nm. The N-type WFM layer 120 may be formed with a thickness of 4-4.5 nm, which is less than the saturation thickness of 6-6.5 nm.

For a relatively relaxed gate endcap tolerance of less than 15 nm, VT is uniform for both the NMOS and PMOS gate stacks. Referring to FIGS. 1A and 1D, in areas shown by the white arrows, the top P-type WFM layer 118 is "shining thru" the bottom thin N-type WFM layer 120 in the NMOS gate stack and renders a VTN whose value is determined by the bottom N-type WFM layer 120 thickness. As long as the gate endcap spacing between the nanowires 108 and the gate plug 116 is a sufficient distance (relaxed), the VT on both sides of the nanowires and 108 is uniform (same "shining thru") since there is enough room to fit both WFMs of opposite polarity.

However, opposite polarity WFM gate stack ability to deliver uniform VT on both sides of the nanowires 106 breaks down for relatively tight gate endcap tolerances of less than 10 nm, as shown in FIGS. 1B and 1C. In NMOS gate stacks, the VT becomes non-uniform, as in areas shown by the black arrows, because on the side of the nanowires 108 facing the gate plug 116, the gate stack primarily comprises just one thick N-WFM layer 120 operating in saturation mode (that is, N-WFM Thickness≥6-6.5 nm and VTN saturation thickness result in very low VT). However, the nanowire side opposite of gate plug 116 comprises an opposite polarity P-type WFM layer 118 and N-type WFM layer 120 stack. Therefore, it has a higher VTN due to the P-type WFM layer 118 shining thru the thin 4-4.5 nm N-type WFM layer 120 stack. As a result, the overall NMOS VT is non-uniform across all nanowire sides for gate endcap tolerances of less than 10 nm. A non-uniform VT renders the structure (e.g., transistor) inefficient because of loss of mobility & drive current.

By contrast, PMOS VT (VTP) is uniform regardless of the gate endcap tolerance since PMOS nanowires 106 are always surrounded by P-type WFM layer 118. That is, VTP operates in saturation mode on all sides of the nanowires 106 (no opposite polarity WFM stack, no N-type WFM layer 120 shining through the thin P-type WFM layer 118).

According to the embodiments of the disclosure, an advanced high transistor density gate all around (GAA) architecture having P-type and N-type metal gates with very tight endcap tolerances, e.g., ≤10-15 nm and tight threshold voltage (VT) uniformity control are provided. In one embodiment, a gate-all-around integrated circuit structure comprises same polarity metal filled gates, which is fabricated using an additive metal gate flow (AMGF) process. In a second embodiment, agate-all-around integrated circuit structure comprises a TiSi N-type conductive layer (e.g., WFM), where the TiSi is formed through atomic layer deposition (ALD). The ALD TiSi N-type conductive layer has a low VTN saturation thickness of approximately 3-3.5 nm that enables uniform VTN across all nanowire sides. The ALD TiSi N-type conductive layer may be fabricated using an additive metal gate flow (AMGF) flow or a subtractive metal gate flow (SMGF).

Figure 2A:
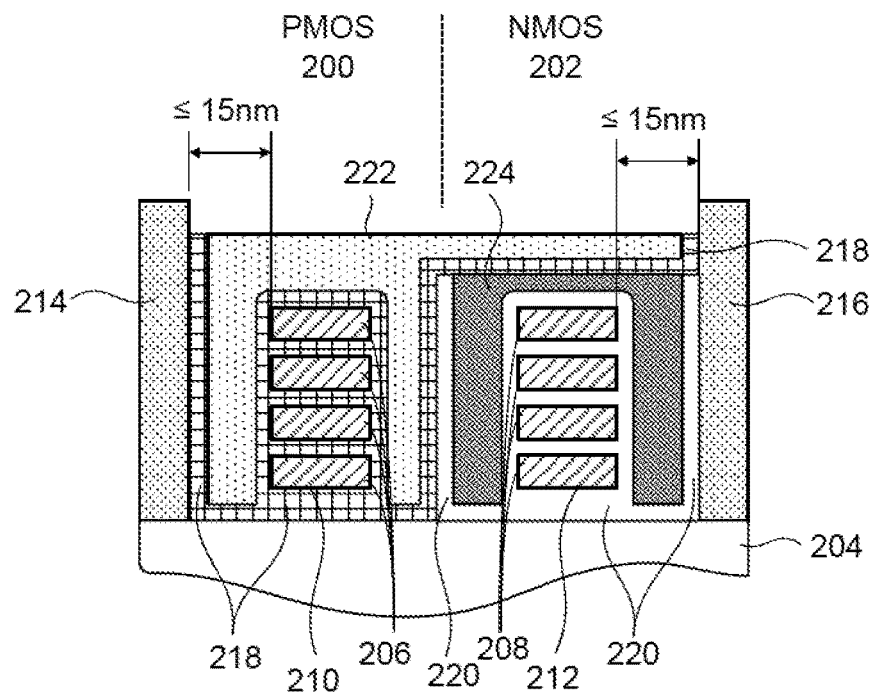
FIGS. 2A-2C illustrate cross-sectional views of GAA IC structures with same polarity metal gates and fabricated using an additive metal gate flow (AMGF) process according to a first embodiment of the disclosure.
Figure 2B:
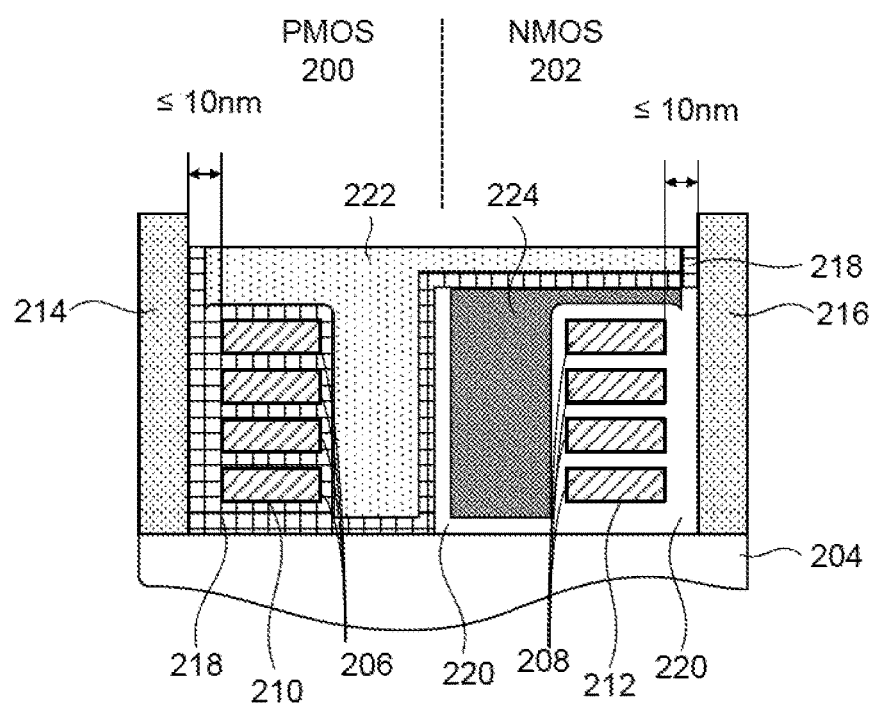
Figure 2C:
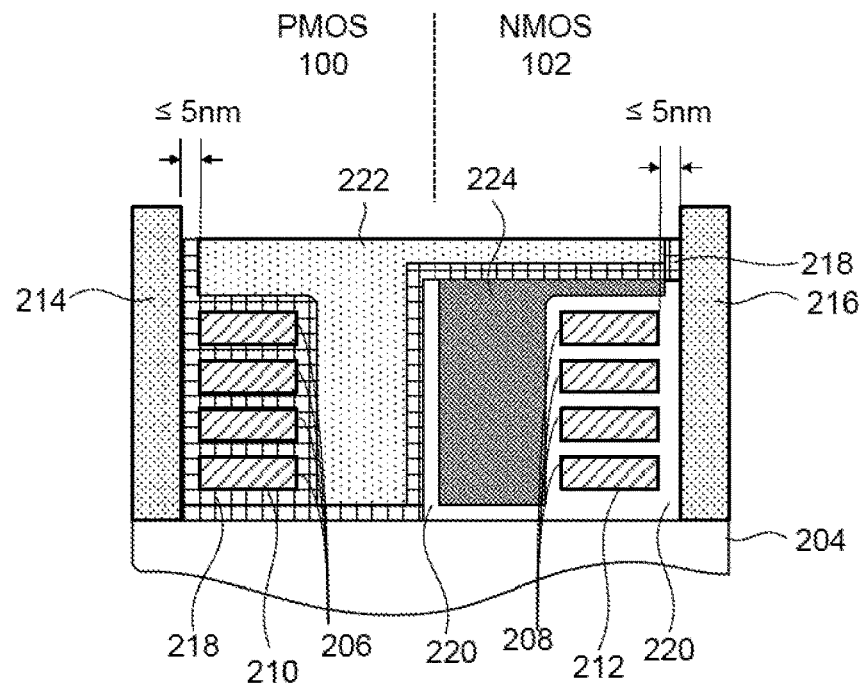

FIGS. 2A-2C illustrate cross-sectional views of GAA IC structures with same polarity metal gates and fabricated using an additive metal gate flow (AMGF) process according to a first embodiment of the disclosure. FIG. 2A shows the GAA IC with a relatively relaxed gate endcap tolerance of less than 15 nm, FIG. 2B shows the GAA IC with a relatively tight gate endcap tolerance of less than 10 nm, and FIG. 2C shows the GAA IC with a relatively very tight endcap tolerance of less than 5 nm.

The GAA IC structure comprises a PMOS region 200 comprising a first gate stack and an NMOS region 202 comprising a second gate stack. The PMOS region 200 includes a first plurality of horizontal nanowires 206 (which can be nanoribbons). The NMOS region 202 includes a second plurality of horizontal nanowires 208 (which can be nanoribbons). In one embodiment, the first plurality of horizontal nanowires 206 is adjacent to the second plurality of horizontal nanowires 208. A gate dielectric 210 surrounds nanowires of the first plurality of horizontal nanowires 206. A second gate dielectric layer 212 surrounds nanowires of the second plurality of horizontal nanowires 208. The PMOS region 200 and the NMOS region 202 are included in a trench in a dielectric layer that forms gate plug 214 adjacent to the PMOS region 200 and gate plug 216 adjacent to the NMOS region 202.

A first gate stack having a P-type WFM (conductive) layer 218 is over the first vertical arrangement of horizontal nanowires 206 (e.g., in PMOS region 200). The first gate stack has a first portion surrounding the nanowires of the first vertical arrangement of horizontal nanowires 206, a second portion extending laterally spaced apart from the first portion along a sidewall of gate plug 214, a third portion extending vertically between the first vertical arrangement of horizontal nanowires 206 and the second vertical arrangement of horizontal nanowires 208, and a fourth portion over the second gate stack.

A second gate stack is over the second vertical arrangement of horizontal nanowires 208 (e.g., in NMOS region 202), the second gate stack having an N-type WFM (conductive) layer 220 with a first portion surrounding the nanowires of the second vertical arrangement of horizontal nanowires 208, a second portion extending laterally spaced apart from the first portion along the vertical third portion of the P-type conductive layer, and a third portion extending laterally beside and spaced apart from the first portion along a sidewall of gate plug 216. According to embodiments, a second N-type WFM fill 224 is formed over the second gate stack and under the fourth portion of the P-type WFM layer 218 to provide the circuit structure with same polarity WFM gates. A P-type WFM fill 222 is shown over P-type WFM layer 218 on both the first gate stack in the PMOS region 100 and the second gate stack in the NMOS region 102.

The GAA IC with same polarity WFM filled gates has been described in which the NMOS gate is filled with N-type WFM fill 224, while the PMOS gate is filled with P-type WFM layer 222. This enables the NMOS gate to have uniform VTN and the PMOS gate to have uniform VTP because the transistors operate in saturation mode on all nanowire sides regardless of a gate endcap tolerance ≤3.5 nm.

In embodiments, the P-type WFM layer 218 may be formed through ALD to a thickness of 3.5-4 nm, which is greater than a saturation thickness of 3.5 nm for the P-type WFM layer. The N-type WFM Fill 218 layer may be the same material as N-type WFM 220 layer.

The GAA IC with same polarity WFM filled gates may be fabricated using AMGF either on the N-type WFM layer 220 (NMOS) or on the P-type WFM layer 218 (PMOS) followed by the subsequent same polarity gate fill (N-type WFM fill 224) and metal dry recess or metal polish at gate level. The PMOS and NMOS gates may be recessed at different levels below gate height with either NMOS or PMOS being recessed deeper or at the same level (not shown) or polished at the gate level/not recessed (not shown). The PMOS and NMOS gates may have two or more metal layers, where one of the one or more metal layers are work function metal layers and at least one metal layers a conductive fill layer. The PMOS gate may comprise P-type WFM metals including, but not limited to, tungsten, cobalt, nickel, molybdenum and conductive metal nitrides such as TiN, VN, or MoN. The NMOS gate may comprise N-type WFM metals including, but not limited to, hafnium, zirconium, titanium, tantalum, aluminum, alloys of these metals, and carbide of these metals such as TaAlC, TaAlN, TiAlC, TiAlN, HfAlC or HfAlN.

Figure 3A:
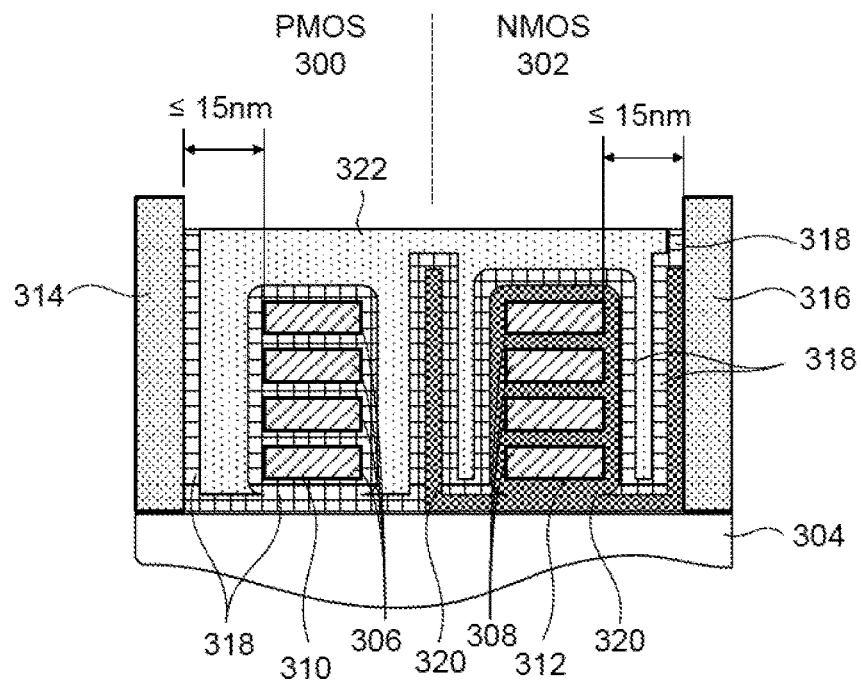
FIGS. 3A-3C illustrate cross-sectional views of GAA IC structures having a TiSi N-type WFM layer and fabricated using an additive metal gate flow (AMGF) process according to a second embodiment of the disclosure.
Figure 3B:
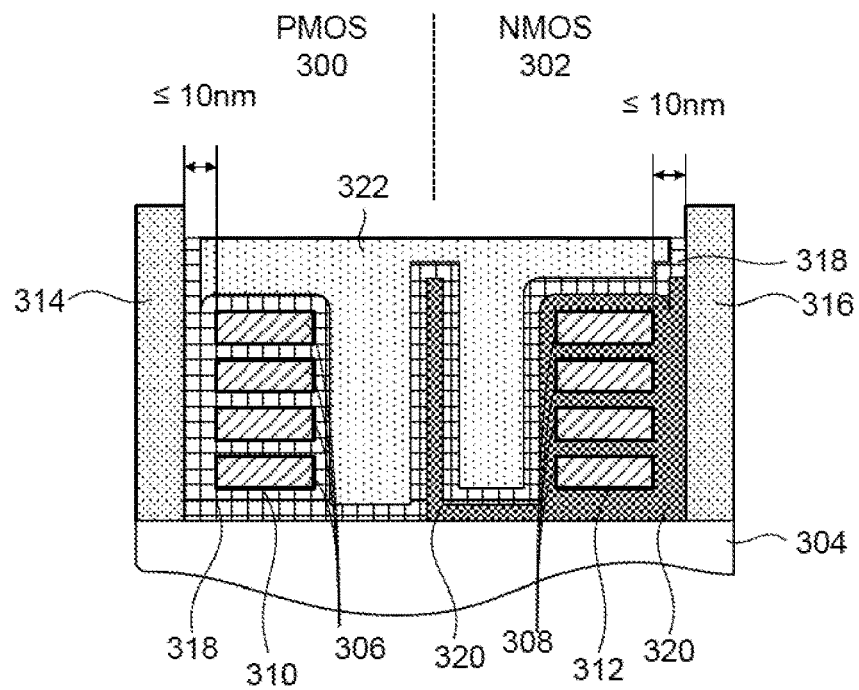
Figure 3C:
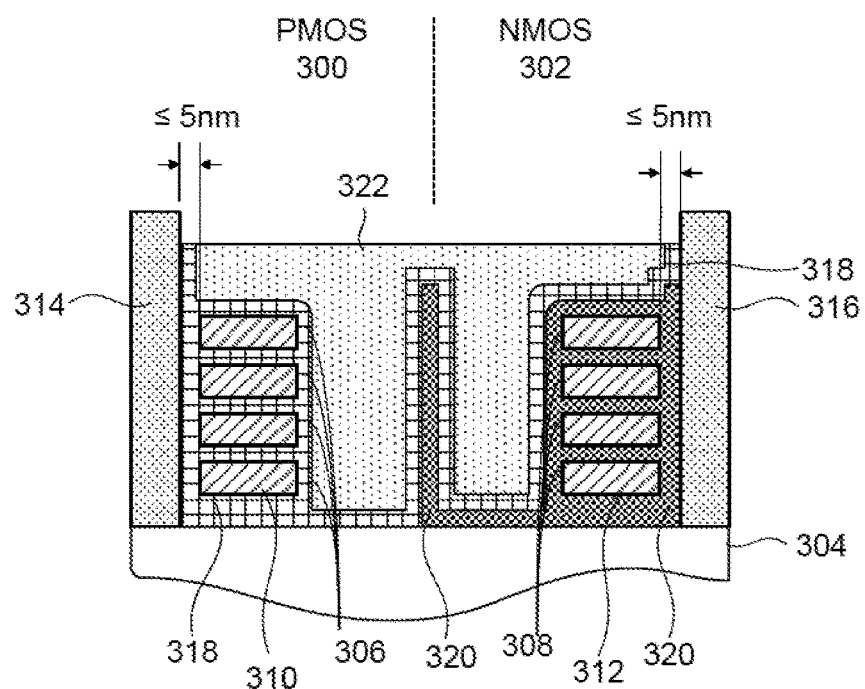

FIGS. 3A-3C illustrate cross-sectional views of GAA IC having a TiSi N-type WFM layer and fabricated using an additive metal gate flow (AMGF) process according to a second embodiment of the disclosure. FIG. 3A shows the GAA IC with a relatively relaxed gate endcap tolerance of less than 15 nm, FIG. 3B shows the GAA IC with a relatively tight gate endcap tolerance of less than 10 nm, and FIG. 3C shows the GAA IC with a relatively very tight endcap tolerance of less than 5 nm.

The GAA IC structure comprises a PMOS region 300 comprising a first gate stack and an NMOS region 302 comprising a second gate stack above a substrate 304. The PMOS region 300 includes a first plurality of horizontal nanowires 306 (which can be nanoribbons). The NMOS region 302 includes a second plurality of horizontal nanowires 308 (which can be nanoribbons). In one embodiment, the first plurality of horizontal nanowires 306 is adjacent to the second plurality of horizontal nanowires 308. A gate dielectric 310 surrounds nanowires of the first plurality of horizontal nanowires 306. A second gate dielectric layer 312 surrounds nanowires of the second plurality of horizontal nanowires 308. The PMOS region 300 and the NMOS region 302 are included in a trench in a dielectric layer that forms gate plug 314 adjacent to the PMOS region 300 and gate plug 316 adjacent to the NMOS region 302.

A first gate stack having a P-type WFM (conductive) layer 318 is over the first vertical arrangement of horizontal nanowires 306 (e.g., in PMOS region 300). The first gate stack has a first portion surrounding the nanowires of the first vertical arrangement of horizontal nanowires 306, a second portion extending laterally spaced apart from the first portion along a sidewall of gate plug 314, a third portion extending vertically between the first vertical arrangement of horizontal nanowires 306 and the second vertical arrangement of horizontal nanowires 308, and a fourth portion conformally covering the second gate stack.

A second gate stack is over the second vertical arrangement of horizontal nanowires 308 (e.g., in NMOS region 302), the second gate stack having a TiSi N-type WFM (conductive) layer 320 with a first portion surrounding the nanowires of the second vertical arrangement of horizontal nanowires 308, a second portion extending laterally beside and spaced apart from the first portion in contact with the third portion of the P-type conductive layer, and a third portion extending laterally beside and spaced apart from the first portion along a sidewall of gate plug 316. The P-type WFM layer 318 (fourth portion) is over the N-type TiSi WFM 320. A P-type WFM fill 322 is shown over both the first gate stack in the PMOS region 300 and the second gate stack in the NMOS region 302.

The P-type WFM layer 318 may be formed through ALD to a thickness of 3.5-4 nm, which is greater than a saturation thickness of 3.5 nm for the P-type WFM layer. According to embodiments, the TiSi N-type WFM layer 320 may be formed through non-selective ALD to a thickness of 3.5-4 nm and a low saturation thickness of 3-3.5 nm in combination with the AMGF process. The low VTN saturation thickness enables uniform VTN because the device operates in saturation mode on all nanowire sides regardless of a gate endcap tolerance ≥3.5 nm even though an opposite polarity P-type WFM layer 318 is over the NMOS gate stack. The PMOS gate may comprise P-type WFM metals including, but not limited to, tungsten, cobalt, nickel, molybdenum and conductive metal nitrides such as TiN, VN, or MoN. A wall comprising TiSi N-type WFM layer 320 may be formed at the N-P boundary specific to the AMGF process coupled with non-selective ALD TiSi.

Figure 4A:
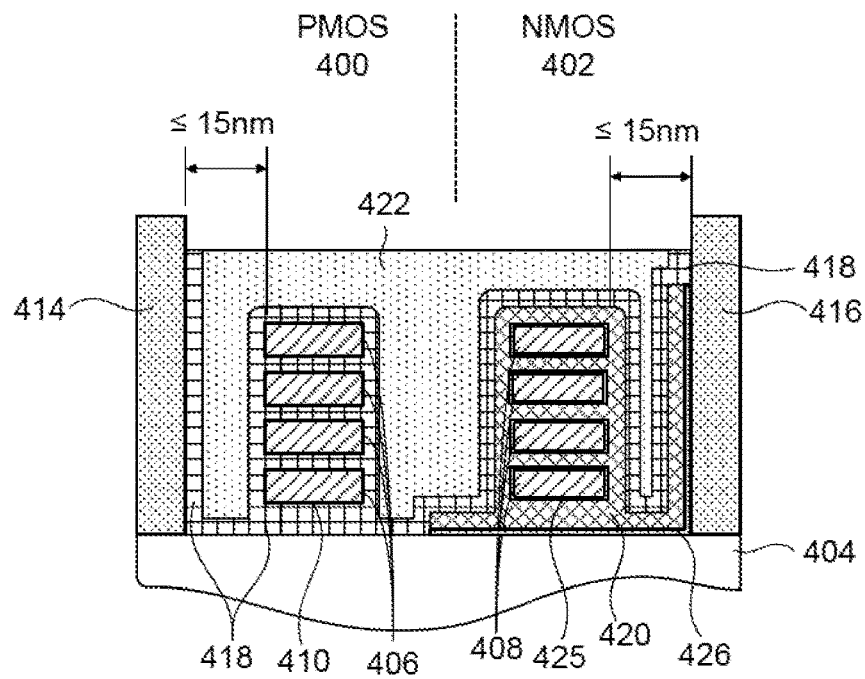
FIGS. 4A-4C illustrate cross-sectional views of GAA IC structures having a TiSi N-type WFM layer and fabricated using a subtractive metal gate flow (SMGF) according to a third embodiment of the disclosure.
Figure 4B:
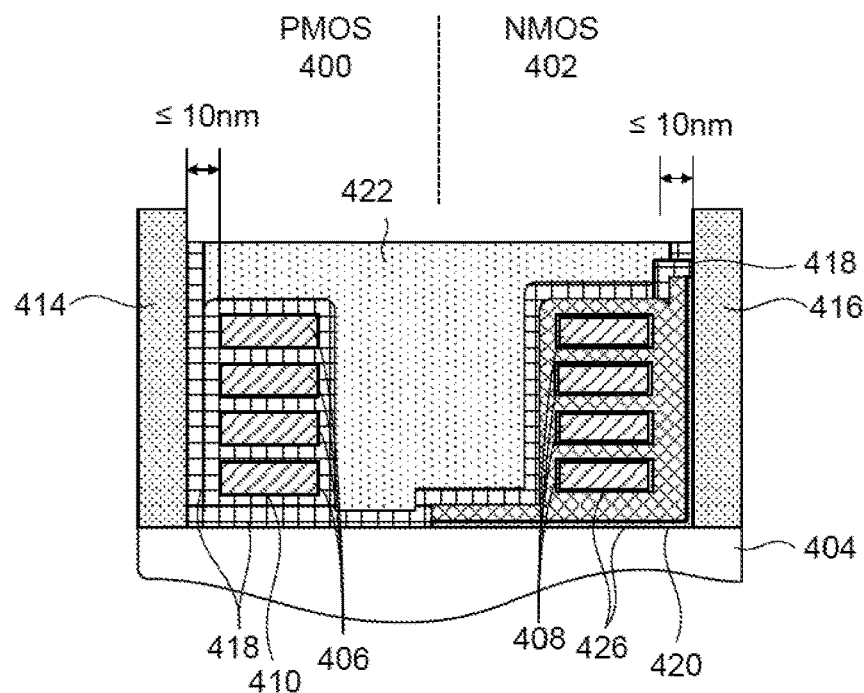
Figure 4C:
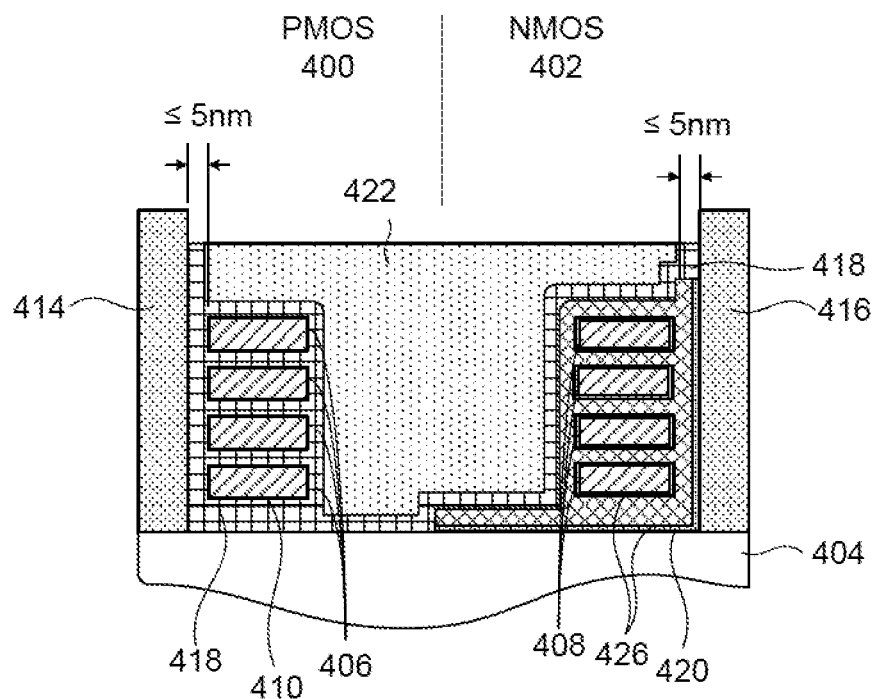

FIGS. 4A-4C illustrate cross-sectional views of GAA IC structures having a TiSi N-type WFM layer and fabricated using a subtractive metal gate flow (SMGF) according to a third embodiment of the disclosure. FIG. 4A shows the GAA IC with a relatively relaxed gate endcap tolerance of less than 15 nm, FIG. 4B shows the GAA IC with a relatively tight gate endcap tolerance of less than 10 nm, and FIG. 4C shows the GAA IC with a relatively very tight endcap tolerance of less than 5 nm.

The GAA IC structure comprises a PMOS region 400 comprising a first gate stack and an NMOS region 402 comprising a second gate stack above a substrate 404. The PMOS region 400 includes a first plurality of horizontal nanowires 406 (which can be nanoribbons). The NMOS region 402 includes a second plurality of horizontal nanowires 408 (which can be nanoribbons). In one embodiment, the first plurality of horizontal nanowires 406 is adjacent to the second plurality of horizontal nanowires 408. A gate dielectric 410 surrounds nanowires of the first plurality of horizontal nanowires 406. A TiN liner 425 may surround nanowires of the second plurality of horizontal nanowires 408. The PMOS region 400 and the NMOS region 402 are included in a trench in a dielectric layer that forms gate plugs 414 and 416.

A first gate stack having a P-type WFM (conductive) layer 418 is over the first vertical arrangement of horizontal nanowires 406 (e.g., in PMOS region 400). The first gate stack has a first portion surrounding the nanowires of the first vertical arrangement of horizontal nanowires 406, a second portion extending laterally spaced apart from the first portion along a sidewall of gate plug 414, and a third portion conformally covering the second gate stack.

A second gate stack is over the second vertical arrangement of horizontal nanowires 408 (e.g., in NMOS region 402). The second gate stack further includes a Selective N-type WFM layer 420 comprising Titanium (Ti) and Silicon (Si). The Selective N-type WFM layer 420 has a first portion surrounding the nanowires of the second vertical arrangement of horizontal nanowires 408, a second portion extending laterally beside the first portion, and third portion extending laterally beside and spaced apart from the first portion along the sidewall of gate plug 416. A layer 426 comprising Titanium (Ti) and "Nitrogen (N) extends under the second gate stack and along a sidewall of plug 416. The P-type WFM layer 418 (third portion) is over the Selective N-type WFM 420. A P-type WFM fill 422 is shown over both the first gate stack in the PMOS region 400 and the second gate stack in the NMOS region 402.

In embodiments, the P-type WFM layer 418 may be formed through ALD to a thickness of 3.5-4 nm, which is greater than a saturation thickness of 3.5 nm for the P-type WFM layer. The Selective N-type WFM layer 420 may be formed through selective ALD to a thickness of 3.5-4 nm which is greater than a TiSi saturation thickness of 3-3.5 nm. The Selective N-type WFM layer 420 may be used with the 0.5-1 nm conductive layer 426 comprising Titanium (Ti) and "Nitrogen (N) that was previously patterned using a SMGF process, such that there is no ALD TiSi wall. Selective ALD TiSi will grow selectively only on top of previously NMOS patterned metallic/conductive TiN, but not on surrounding dielectrics/insulators like SiOx, HfOx, SiNx or SiCx.

The low VTN saturation thickness enables uniform VTN because the device operates in saturation mode on all nanowire sides regardless of a gate endcap tolerance ≥3.5 nm even though an opposite polarity P-type conductive layer 422 is over the second gate stack in the NMOS region. The PMOS gate may comprise P-type WFM metals including, but not limited to, tungsten, cobalt, nickel, molybdenum and conductive metal nitrides such as TiN, VN, or MoN.

The disclosed embodiments provide uniform VT/high efficiency/high mobility N-type and P-type transistors for very tight gate endcap tolerances ≤10 nm, which enables extremely high transistor density for advanced semiconductor processing nodes. In both the same polarity WFM Filled gate embodiments and the ALD N-type WFM gate embodiments, the gate endcaps may be PCT (Poly Cut), prior/incoming to metal gate formation or metal gate cut (MGC) after metal gate formation. The disclosed embodiments may pertain to GAA or FinFET transistor architectures utilizing same polarity WFM filled gates or ALD N-type WFM gates. Multi-VT transistor architecture may be achieved using either dipoles or traditional thin TiN/TaN VT Adjust VTA layers for both same polarity WFM filled gates and ALD N-type WFM gates or a combination of both.

It is to be appreciated that not all aspects of the processes described above need be practiced to fall within the spirit and scope of embodiments of the present disclosure. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a nanowire device, a nanoribbon device, a tri-gate device, an independently accessed double gate device, or a FIN-FET. One or more embodiments may be particularly useful for fabricating semiconductor devices at a sub-10 nanometer (10 nm) technology node.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion lithography (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In another aspect, one or more embodiments are directed to neighboring semiconductor structures or devices separated by self-aligned gate endcap (SAGE) structures. Particular embodiments may be directed to integration of multiple width (multi-Wsi) nanowires and nanoribbons in a SAGE architecture and separated by a SAGE wall. In an embodiment, nanowires/nanoribbons are integrated with multiple Wsi in a SAGE architecture portion of a front-end process flow. Such a process flow may involve integration of nanowires and nanoribbons of different Wsi to provide robust functionality of next generation transistors with low power and high performance. Associated epitaxial source or drain regions may be embedded (e.g., portions of nanowires removed and then source or drain (S/D) growth is performed).

Figure 5:
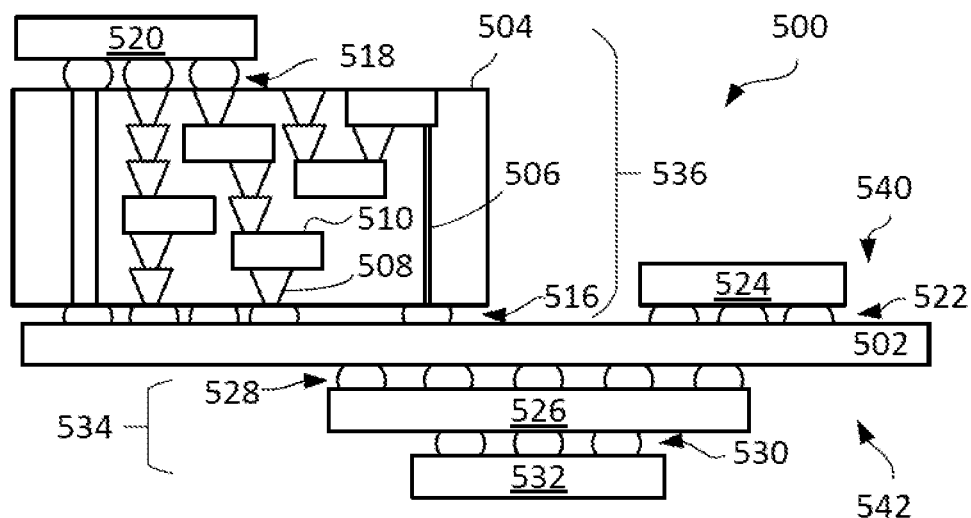
FIG. 5 is a cross-sectional side view of an IC device assembly that may include one or more transistor architectures utilizing same polarity WFM filled gates or ALD TiSi N-type WFM gates, in accordance with one or more of the embodiments disclosed herein.

FIG. 5 is a cross-sectional side view of an integrated circuit (IC) device assembly that may include one or more transistor architectures utilizing same polarity WFM filled gates or ALD TiSi N-type WFM gates, in accordance with one or more of the embodiments disclosed herein.

Referring to FIG. 5, an IC device assembly 500 includes components having one or more integrated circuit structures described herein. The IC device assembly 500 includes a number of components disposed on a circuit board 502 (which may be, e.g., a motherboard). The IC device assembly 500 includes components disposed on a first face 540 of the circuit board 502 and an opposing second face 542 of the circuit board 502. Generally, components may be disposed on one or both faces 540 and 542. In particular, any suitable ones of the components of the IC device assembly 500 may include a number of transistor architectures utilizing same polarity WFM filled gates or ALD TiSi N-type WFM gates, such as disclosed herein.

In some embodiments, the circuit board 502 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 502. In other embodiments, the circuit board 502 may be a non-PCB substrate.

The IC device assembly 500 illustrated in FIG. 5 includes a package-on-interposer structure 536 coupled to the first face 540 of the circuit board 502 by coupling components 516. The coupling components 516 may electrically and mechanically couple the package-on-interposer structure 536 to the circuit board 502, and may include solder balls (as shown in FIG. 5), male and female portions of a socket, an adhesive, an underfill material, and/or any other suitable electrical and/or mechanical coupling structure.

The package-on-interposer structure 536 may include an IC package 520 coupled to an interposer 504 by coupling components 518. The coupling components 518 may take any suitable form for the application, such as the forms discussed above with reference to the coupling components 516. Although a single IC package 520 is shown in FIG. 5, multiple IC packages may be coupled to the interposer 504. It is to be appreciated that additional interposers may be coupled to the interposer 504. The interposer 504 may provide an intervening substrate used to bridge the circuit board 502 and the IC package 520. The IC package 520 may be or include, for example, a die, or any other suitable component. Generally, the interposer 504 may spread a connection to a wider pitch or reroute a connection to a different connection. For example, the interposer 504 may couple the IC package 520 (e.g., a die) to a ball grid array (BGA) of the coupling components 516 for coupling to the circuit board 502. In the embodiment illustrated in FIG. 5, the IC package 520 and the circuit board 502 are attached to opposing sides of the interposer 504. In other embodiments, the IC package 520 and the circuit board 502 may be attached to a same side of the interposer 504. In some embodiments, three or more components may be interconnected by way of the interposer 504.

The interposer 504 may be formed of an epoxy resin, a fiberglass-reinforced epoxy resin, a ceramic material, or a polymer material such as polyimide. In some implementations, the interposer 504 may be formed of alternate rigid or flexible materials that may include the same materials described above for use in a semiconductor substrate, such as silicon, germanium, and other group III-V and group IV materials. The interposer 504 may include metal interconnects 510 and vias 508, including but not limited to through-silicon vias (TSVs) 506. The interposer 504 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 504. The package-on-interposer structure 536 may take the form of any of the package-on-interposer structures known in the art.

The IC device assembly 500 may include an IC package 524 coupled to the first face 540 of the circuit board 502 by coupling components 522. The coupling components 522 may take the form of any of the embodiments discussed above with reference to the coupling components 516, and the IC package 524 may take the form of any of the embodiments discussed above with reference to the IC package 520.

The IC device assembly 500 illustrated in FIG. 5 includes a package-on-package structure 534 coupled to the second face 542 of the circuit board 502 by coupling components 528. The package-on-package structure 534 may include an IC package 526 and an IC package 532 coupled together by coupling components 530 such that the IC package 526 is disposed between the circuit board 502 and the IC package 532. The coupling components 528 and 530 may take the form of any of the embodiments of the coupling components 516 discussed above, and the IC packages 526 and 532 may take the form of any of the embodiments of the IC package 520 discussed above. The package-on-package structure 534 may be configured in accordance with any of the package-on-package structures known in the art.

Figure 6:
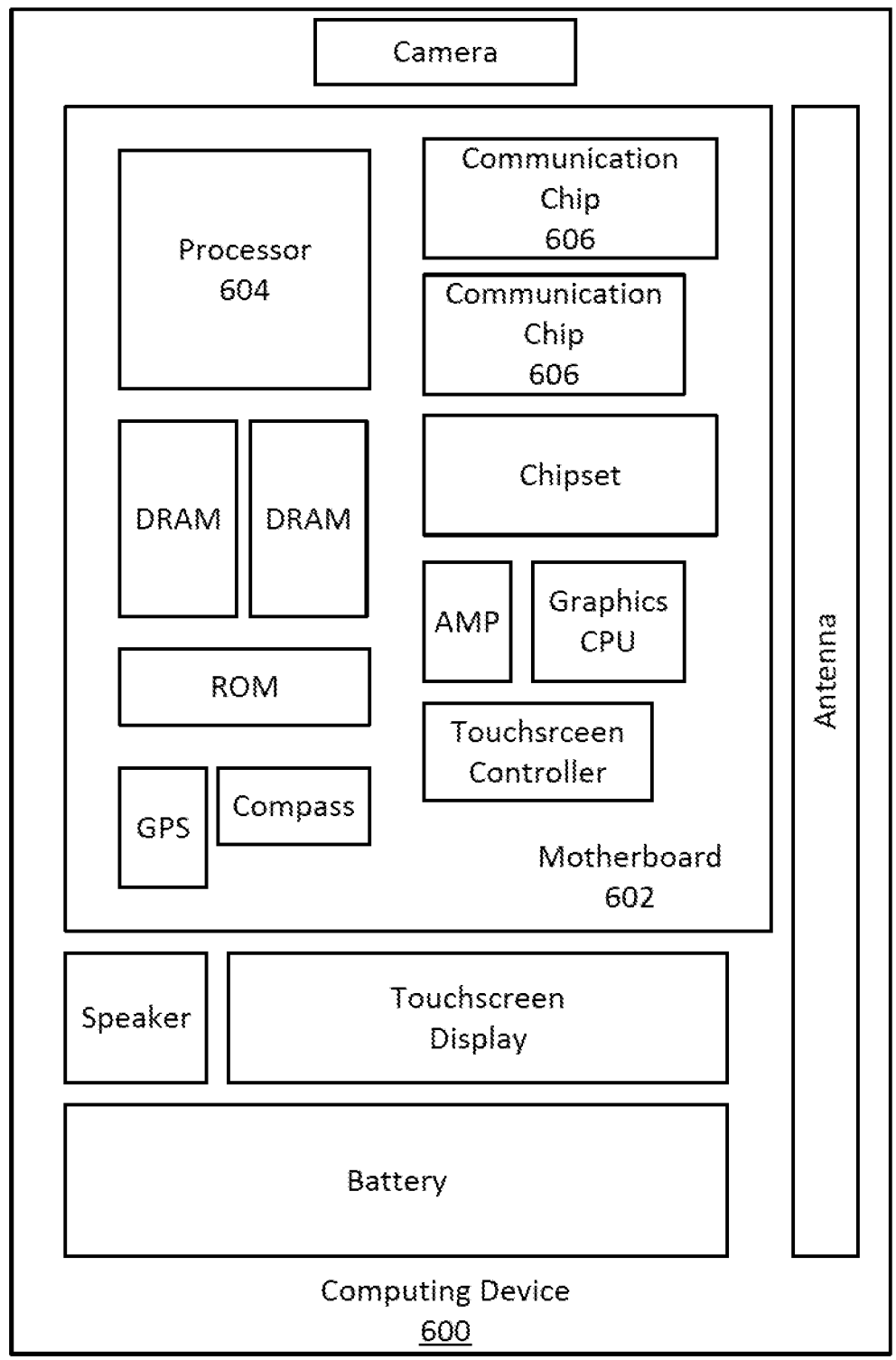
FIG. 6 illustrates a computing device in accordance with one implementation of the disclosure.

FIG. 6 illustrates a computing device 600 in accordance with one implementation of the disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the disclosure, the integrated circuit die of the processor includes one or more transistor architectures utilizing same polarity WFM filled gates or ALD N-type WFM comprising Titanium (Ti) and "Nitrogen (N) gates, in accordance with implementations of embodiments of the disclosure. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of embodiments of the disclosure, the integrated circuit die of the communication chip includes one or more transistor architectures utilizing same polarity WFM filled gates or ALD N-type WFM comprising Titanium (Ti) and "Nitrogen (N) gates, in accordance with implementations of embodiments of the disclosure.

In further implementations, another component housed within the computing device 600 may contain an integrated circuit die that includes one or more transistor architectures utilizing same polarity WFM filled gates or ALD N-type WFM comprising Titanium (Ti) and "Nitrogen (N) gates, in accordance with implementations of embodiments of the disclosure.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Thus, embodiments described herein include transistor architectures utilizing same polarity WFM filled gates or ALD N-type WFM comprising Titanium (Ti) and "Nitrogen (N) gates.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure comprises a first and second vertical arrangement of horizontal nanowires in a PMOS region and in an NMOS region. A first gate stack is over the first vertical arrangement of horizontal nanowires, the first gate stack having a P-type conductive layer surrounding the horizontal nanowires, a second portion extending laterally spaced apart from the first portion along a sidewall of a first gate plug, a third portion extending vertically between the first vertical arrangement of horizontal nanowires and the second vertical arrangement of horizontal nanowires, and a fourth portion over a second gate stack. The second gate stack is over the second vertical arrangement of horizontal nanowires, the second gate stack having an N-type conductive layer with a first portion surrounding the nanowires of the second vertical arrangement of horizontal nanowires, a second portion extending vertically and laterally beside and spaced apart from the first portion along the vertical third portion of the P-type conductive layer, and a third portion extending laterally beside and spaced apart from the first portion along a sidewall of a second gate plug. The second gate stack includes an N-type conductive fill over the second gate stack and under the fourth portion of the first gate stack to provide the integrated circuit structure with same polarity filled gates.

Example embodiment 2: The integrated circuit structure of embodiment 1, wherein a P-type conductive fill is over both the first gate stack in the PMOS region and the second gate stack in the NMOS region.

Example embodiment 3: The integrated circuit structure of embodiment 1 or 2, wherein the integrated circuit structure comprises transistors that operate in saturation mode on all nanowire sides regardless of a gate endcap tolerance between 3.5 nm and 10 nm.

Example embodiment 4: The integrated circuit structure of embodiment 1, 2, or 3, wherein the P-type conductive layer has a thickness of approximately 3.5-4 nm, which is greater than a saturation thickness of 3.5 nm for the P-type conductive layer.

Example embodiment 5: The integrated circuit structure of embodiment 1, 2, 3, or 4, wherein the N-type conductive layer and the N-type conductive fill are of a same material type.

Example embodiment 6: The integrated circuit structure of embodiment 1, 2, 3, 4 or 5, wherein the first gate stack and the second gate stack are recessed at different levels below a gate height.

Example embodiment 7: An integrated circuit structure comprises a first vertical arrangement of horizontal nanowires in a PMOS region and a second vertical arrangement of horizontal nanowires in an NMOS region. A first gate stack is over the first vertical arrangement of horizontal nanowires, the first gate stack having a P-type conductive layer with a first portion surrounding the nanowires of the first vertical arrangement of horizontal nanowires, a second portion extending laterally spaced apart from the first portion along a sidewall of gate plug, a third portion extending vertically between the first vertical arrangement of horizontal nanowires and the second vertical arrangement of horizontal nanowires, and a fourth portion conformally covering a second gate stack. The second gate stack is over the second vertical arrangement of horizontal nanowires, the second gate stack having an N-type conductive layer comprising Titanium (Ti) and "Nitrogen (N) with a first portion surrounding the nanowires of the second vertical arrangement of horizontal nanowires, a second portion extending laterally beside and spaced apart from the first portion in contact with the third portion of the P-type conductive layer, and a third portion extending laterally beside and spaced apart from the first portion along a sidewall of a second gate plug.

Example embodiment 8: The integrated circuit structure of embodiment 7, wherein a P-type conductive fill is over both the first gate stack in the PMOS region and the second gate stack in the NMOS region.

Example embodiment 9: The integrated circuit structure of embodiment 7 or 8, wherein the integrated circuit structure comprises transistors that operate in saturation mode on all nanowire sides regardless of a gate endcap tolerance between 3.5 nm and 10 nm even though an opposite polarity P-type conductive layer is over the second gate stack in the NMOS region.

Example embodiment 10: The integrated circuit structure of embodiment 7, 8 or 9, wherein the N-type conductive layer comprising Titanium (Ti) and "Nitrogen (N) has a thickness of approximately 3.5-4 nm, which is greater than a saturation thickness of 3-3.5 nm for the N-type conductive layer comprising Titanium (Ti) and "Nitrogen (N).

Example embodiment 11: The integrated circuit structure of embodiment 7, 8, 9 or 10, wherein the P-type conductive layer has a thickness of approximately 3.5-4 nm, which is greater than a saturation thickness of 3.5 nm for the P-type conductive layer.

Example embodiment 12: An integrated circuit structure comprises a first vertical arrangement of horizontal nanowires in a PMOS region. A second vertical arrangement of horizontal nanowires is in an NMOS region. A first gate stack is over the first vertical arrangement of horizontal nanowires, the first gate stack having a P-type conductive layer with a first portion surrounding the nanowires of the first vertical arrangement of horizontal nanowires a second portion extending laterally spaced apart from the first portion along a sidewall of gate plug, a third portion conformally covering a second gate stack. The second gate stack is over the second vertical arrangement of horizontal nanowires, the second gate stack having an N-type conductive layer comprising Titanium (Ti) and "Nitrogen (N) with a first portion surrounding the nanowires of the second vertical arrangement of horizontal nanowires, a second portion extending laterally beside the first portion, and a third portion extending laterally beside and spaced apart from the first portion along a sidewall of a second gate plug. A TiN layer extends under the second gate stack and along a sidewall of the second gate endcap.

Example embodiment 13: The integrated circuit structure of embodiment 12, wherein a P-type conductive fill over both the first gate stack in the PMOS region and the second gate stack in the NMOS region.

Example embodiment 14: The integrated circuit structure of embodiment 12 or 13, wherein a TiN liner surrounds nanowires of the second vertical arrangement of horizontal nanowires.

Example embodiment 15: The integrated circuit structure of embodiment 12, 13 or 14, wherein the integrated circuit structure comprises transistors that operate in saturation mode on all nanowire sides regardless of a gate endcap tolerance between 3.5 nm and 10 nm even though an opposite polarity P-type conductive layer is over the second gate stack in the NMOS region.

Example embodiment 16: The integrated circuit structure of embodiment 12, 13, 14, or 15, wherein the N-type conductive layer comprising Titanium (Ti) and "Nitrogen (N) has a thickness of approximately 3.5-4 nm, which is greater than a saturation thickness of 3-3.5 nm for the N-type conductive layer comprising Titanium (Ti) and "Nitrogen (N).

Example embodiment 17: The integrated circuit structure of embodiment 12, 13, 14, 15 or 16, wherein the P-type conductive layer has a thickness of approximately 3.5-4 nm, which is greater than a saturation thickness of 3.5 nm for the P-type conductive layer.

Example embodiment 18: A computing device comprises a board; and a component coupled to the board. The component includes an integrated circuit structure comprises a first vertical arrangement of horizontal nanowires in a PMOS region, and a second vertical arrangement of horizontal nanowires in an NMOS region. A first gate stack is over the first vertical arrangement of horizontal nanowires, the first gate stack having a P-type conductive layer with a first portion surrounding the nanowires of the first vertical arrangement of horizontal nanowires, a second portion extending laterally spaced apart from the first portion along a sidewall of a first gate plug, a third portion extending vertically between the first vertical arrangement of horizontal nanowires and the second vertical arrangement of horizontal nanowires, and a fourth portion over a second gate stack. The second gate stack is over the second vertical arrangement of horizontal nanowires, the second gate stack having an N-type conductive layer with a first portion surrounding the nanowires of the second vertical arrangement of horizontal nanowires, a second portion extending vertically and laterally beside and spaced apart from the first portion along the vertical third portion of the P-type conductive layer, and a third portion extending laterally beside and spaced apart from the first portion along a sidewall of a second gate plug, wherein the second gate stack includes an N-type conductive fill over the second gate stack and under the fourth portion of the first gate stack to provide the integrated circuit structure with same polarity filled gates. A P-type conductive fill is over both the first gate stack in the PMOS region and the second gate stack in the NMOS region.

Example embodiment 19: The computing device of embodiment 18, wherein the integrated circuit structure comprises transistors that operate in saturation mode on all nanowire sides regardless of a gate endcap tolerance between 3.5 nm and 10 nm.

Example embodiment 20: The computing device of embodiment 18 or 19, wherein the N-type conductive layer and the N-type conductive fill are of a same material type.

What is claimed is:
1. An integrated circuit structure, comprising:
a first vertical arrangement of horizontal nanowires in a PMOS region;
a second vertical arrangement of horizontal nanowires in an NMOS region;
a first gate stack over the first vertical arrangement of horizontal nanowires, the first gate stack having a P-type conductive layer with a first portion surrounding the nanowires of the first vertical arrangement of horizontal nanowires, a second portion extending laterally spaced apart from the first portion along a sidewall of a first gate plug, a third portion extending vertically between the first vertical arrangement of horizontal nanowires and the second vertical arrangement of horizontal nanowires, and a fourth portion over a second gate stack; and
the second gate stack over the second vertical arrangement of horizontal nanowires, the second gate stack having an N-type conductive layer with a first portion surrounding the nanowires of the second vertical arrangement of horizontal nanowires, a second portion extending vertically and laterally beside and spaced apart from the first portion along the vertical third portion of the P-type conductive layer, and a third portion extending laterally beside and spaced apart from the first portion along a sidewall of a second gate plug,
wherein the second gate stack includes an N-type conductive fill over the second gate stack and under the fourth portion of the first gate stack to provide the integrated circuit structure with same polarity filled gates.

2. The integrated circuit structure of claim 1, wherein a P-type conductive fill is over both the first gate stack in the PMOS region and the second gate stack in the NMOS region.

3. The integrated circuit structure of claim 1, wherein the integrated circuit structure comprises transistors that operate in saturation mode on all nanowire sides regardless of a gate endcap tolerance between 3.5 nm and 10 nm.

4. The integrated circuit structure of claim 1, wherein the P-type conductive layer has a thickness of approximately 3.5-4 nm, which is greater than a saturation thickness of 3.5 nm for the P-type conductive layer.

5. The integrated circuit structure of claim 1, wherein the N-type conductive layer and the N-type conductive fill are of a same material type.

6. The integrated circuit structure of claim 1, wherein the first gate stack and the second gate stack are recessed at different levels below a gate height.

7. An integrated circuit structure, comprising:
- a first vertical arrangement of horizontal nanowires in a PMOS region;
- a second vertical arrangement of horizontal nanowires in an NMOS region;
- a first gate stack over the first vertical arrangement of horizontal nanowires, the first gate stack having a P-type conductive layer with a first portion surrounding the nanowires of the first vertical arrangement of horizontal nanowires, a second portion extending laterally spaced apart from the first portion along a sidewall of a first gate plug, a third portion extending vertically between the first vertical arrangement of horizontal nanowires and the second vertical arrangement of horizontal nanowires, and a fourth portion conformally covering a second gate stack; and
- the second gate stack over the second vertical arrangement of horizontal nanowires, the second gate stack having an N-type conductive layer comprising Titanium (Ti) and Nitrogen (N) with a first portion surrounding the nanowires of the second vertical arrangement of horizontal nanowires, a second portion extending laterally beside and spaced apart from the first portion in contact with the third portion of the P-type conductive layer, and a third portion extending laterally beside and spaced apart from the first portion along a sidewall of a second gate plug.

8. The integrated circuit structure of claim 7, wherein a P-type conductive fill is over both the first gate stack in the PMOS region and the second gate stack in the NMOS region.

9. The integrated circuit structure of claim 7, wherein the integrated circuit structure comprises transistors that operate in saturation mode on all nanowire sides regardless of a gate endcap tolerance between 3.5 nm and 10 nm even though an opposite polarity P-type conductive layer is over the second gate stack in the NMOS region.

10. The integrated circuit structure of claim 7, wherein the N-type conductive layer comprising Titanium (Ti) and Nitrogen (N) has a thickness of approximately 3.5-4 nm, which is greater than a saturation thickness of 3-3.5 nm for the N-type conductive layer comprising Titanium (Ti) and Nitrogen (N).

11. The integrated circuit structure of claim 7, wherein the P-type conductive layer has a thickness of approximately 3.5-4 nm, which is greater than a saturation thickness of 3.5 nm for the P-type conductive layer.

12. An integrated circuit structure, comprising:
- a first vertical arrangement of horizontal nanowires in a PMOS region;
- a second vertical arrangement of horizontal nanowires in an NMOS region;
- a first gate stack over the first vertical arrangement of horizontal nanowires, the first gate stack having a P-type conductive layer with a first portion surrounding the nanowires of the first vertical arrangement of horizontal nanowires a second portion extending laterally spaced apart from the first portion along a sidewall of a first gate plug, a third portion conformally covering a second gate stack;
- the second gate stack over the second vertical arrangement of horizontal nanowires, the second gate stack having an N-type conductive layer comprising Titanium (Ti) and Nitrogen (N) with a first portion surrounding the nanowires of the second vertical arrangement of horizontal nanowires, a second portion extending laterally beside the first portion, and a third portion extending laterally beside and spaced apart from the first portion along a sidewall of a second gate plug; and
- a TiN layer extending under the second gate stack and along the sidewall of the second gate plug.

13. The integrated circuit structure of claim 12, wherein a P-type conductive fill over both the first gate stack in the PMOS region and the second gate stack in the NMOS region.

14. The integrated circuit structure of claim 12, wherein a liner comprising Titanium (Ti) and Nitrogen (N) surrounds nanowires of the second vertical arrangement of horizontal nanowires.

15. The integrated circuit structure of claim 12, wherein the integrated circuit structure comprises transistors that operate in saturation mode on all nanowire sides regardless of a gate endcap tolerance between 3.5 nm and 10 nm even though an opposite polarity P-type conductive layer is over the second gate stack in the NMOS region.

16. The integrated circuit structure of claim 12, wherein the N-type conductive layer comprising Titanium (Ti) and Nitrogen (N) has a thickness of approximately 3.5-4 nm, which is greater than a saturation thickness of 3-3.5 nm for the N-type conductive layer comprising Titanium (Ti) and Nitrogen (N).

17. The integrated circuit structure of claim 12, wherein the P-type conductive layer has a thickness of approximately 3.5-4 nm, which is greater than a saturation thickness of 3.5 nm for the P-type conductive layer.

18. A computing device, comprising:
- a board; and
- a component coupled to the board, the component including an integrated circuit structure, comprising:
- a first vertical arrangement of horizontal nanowires in a PMOS region;
- a second vertical arrangement of horizontal nanowires in an NMOS region;
- a first gate stack over the first vertical arrangement of horizontal nanowires, the first gate stack having a P-type conductive layer with a first portion surrounding the nanowires of the first vertical arrangement of horizontal nanowires, a second portion extending laterally spaced apart from the first portion along a sidewall of a first gate plug, a third portion extending vertically between the first vertical arrangement of horizontal nanowires and the second vertical arrangement of horizontal nanowires, and a fourth portion over a second gate stack;
- the second gate stack over the second vertical arrangement of horizontal nanowires, the second gate stack having an N-type conductive layer with a first portion surrounding the nanowires of the second vertical arrangement of horizontal nanowires, a second portion extending vertically and laterally beside and spaced apart from the first portion along the vertical third portion of the P-type conductive layer, and a third portion extending laterally beside and spaced apart from the first portion along a sidewall of a second gate plug, wherein the second gate stack includes an N-type conductive fill over the second gate stack and under the fourth portion of the first gate stack to provide the integrated circuit structure with same polarity filled gates; and a P-type conductive fill is over both the first gate stack in the PMOS region and the second gate stack in the NMOS region.

19. The computing device of claim 18, wherein the integrated circuit structure comprises transistors that operate in saturation mode on all nanowire sides regardless of a gate endcap tolerance between 3.5 nm and 10 nm.

20. The computing device of claim 19, wherein the N-type conductive layer and the N-type conductive fill are of a same material type.

* * * * *